United States Patent
Kani

(10) Patent No.: US 11,223,377 B2
(45) Date of Patent: Jan. 11, 2022

(54) FRONT-END CIRCUIT

(71) Applicant: Murata Manufacturing Co., Ltd., Kyoto (JP)

(72) Inventor: Hiroyuki Kani, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 17/037,938

(22) Filed: Sep. 30, 2020

(65) Prior Publication Data

US 2021/0013912 A1 Jan. 14, 2021

Related U.S. Application Data

(63) Continuation of application No. PCT/JP2019/010640, filed on Mar. 14, 2019.

(30) Foreign Application Priority Data

Jun. 25, 2018 (JP) .............................. JP2018-119629

(51) Int. Cl.
*H04B 1/04* (2006.01)

(52) U.S. Cl.
CPC .......... *H04B 1/0458* (2013.01); *H04B 1/0475* (2013.01); *H04B 1/0483* (2013.01); *H04B 2001/0408* (2013.01)

(58) Field of Classification Search
CPC .... H04B 1/006; H04B 1/0057; H04B 1/0458; H04B 1/0475; H04B 1/0483; H04B 2001/04

(Continued)

(56) References Cited

U.S. PATENT DOCUMENTS

| | | | | |
|---|---|---|---|---|
| 2010/0316027 A1* | 12/2010 | Rick | ...................... | H04B 1/406 370/336 |
| 2011/0260806 A1* | 10/2011 | Takeuchi | ............... | H03H 7/461 333/103 |

(Continued)

FOREIGN PATENT DOCUMENTS

| | | |
|---|---|---|
| JP | 2014093589 A | 5/2014 |
| JP | 2016063241 A | 4/2016 |

(Continued)

OTHER PUBLICATIONS

International Search Report issued in Application No. PCT/JP2019/010640, dated May 28, 2019.

(Continued)

*Primary Examiner* — Emmanuel Bayard
(74) *Attorney, Agent, or Firm* — Pearne & Gordon LLP

(57) ABSTRACT

A front-end circuit includes a power amplifier circuit configured to amplify power of multiple transmission waves having different frequency bands, a transmission filter provided between the power amplifier circuit and an antenna and configured to pass a predetermined transmission frequency band of an output signal of the power amplifier circuit, a switch provided between the power amplifier circuit and the antenna, and a matching circuit. In accordance with switching of whether the matching circuit is connected, an insertion loss in a frequency band of an intermodulation distortion within a communication band in an intra-band carrier aggregation mode is increased as compared to an insertion loss in a frequency band of an intermodulation distortion within the communication band in a single mode.

20 Claims, 11 Drawing Sheets

(58) Field of Classification Search
USPC .......................................... 375/219, 262, 318
See application file for complete search history.

(56) References Cited

U.S. PATENT DOCUMENTS

| | | | |
|---|---|---|---|
| 2014/0055210 A1* | 2/2014 | Black | H04B 1/525 |
| | | | 333/132 |
| 2014/0112213 A1* | 4/2014 | Norholm | H04B 1/006 |
| | | | 370/277 |
| 2014/0119296 A1 | 5/2014 | Akutagawa | |
| 2014/0256271 A1* | 9/2014 | Kok | H04B 1/44 |
| | | | 455/78 |
| 2014/0307599 A1* | 10/2014 | Rousu | H04L 5/1461 |
| | | | 370/297 |
| 2016/0080010 A1 | 3/2016 | Ota et al. | |
| 2016/0134414 A1* | 5/2016 | Pehlke | H04L 5/1469 |
| | | | 370/280 |
| 2016/0285484 A1 | 9/2016 | Weissman et al. | |
| 2016/0365878 A1* | 12/2016 | Balm | H04B 1/006 |
| 2017/0048859 A1 | 2/2017 | Hayakawa | |
| 2017/0063404 A1* | 3/2017 | Langer | H04B 1/0057 |
| 2017/0063411 A1* | 3/2017 | Ripley | H04B 1/1027 |
| 2017/0244432 A1* | 8/2017 | Ranta | H04B 1/0053 |
| 2017/0302328 A1 | 10/2017 | Obiya et al. | |
| 2018/0076834 A1* | 3/2018 | Wloczysiak | H04B 1/005 |
| 2019/0013790 A1* | 1/2019 | Ayranci | H03H 7/0161 |

FOREIGN PATENT DOCUMENTS

| | | |
|---|---|---|
| JP | 2017038352 A | 2/2017 |
| JP | 2017163232 A | 9/2017 |
| JP | 2018509852 A | 4/2018 |
| WO | 2016117482 A1 | 7/2016 |

OTHER PUBLICATIONS

Written Opinion issued in Application No. PCT/JP2019/010640, dated May 28, 2019.

* cited by examiner

FRONT-END CIRCUIT

This is a continuation of International Application No. PCT/JP2019/010640 filed on Mar. 14, 2019 which claims priority from Japanese Patent Application No. 2018-119629 filed on Jun. 25, 2018. The contents of these applications are incorporated herein by reference in their entireties.

BACKGROUND OF THE DISCLOSURE

1. Field of the Disclosure

The present disclosure relates to a front-end circuit that is provided between an antenna and a power amplifier circuit that amplifies the power of a transmission wave.

2. Description of the Related Art

Hitherto, carrier aggregation (CA) for increasing a communication rate by using multiple transmission waves having different frequency bands at a time has been used. For example, carrier aggregation that is one of element technologies of LTE-Advanced widens an effective communication band by performing communications using multiple transmission waves (LTE carriers) of up to 20 MHz, called component carriers (CCs), at a time. According to the frequency arrangement of CCs, CA is classified into intra-band contiguous CA that uses CCs contiguous in a single communication band, intra-band non-contiguous CA that uses CCs not contiguous in a single communication band, and inter-band non-contiguous CA that uses CCs respectively included in different communication bands.

Japanese Unexamined Patent Application Publication No. 2016-063241 describes that, when the above-described intra-band contiguous CA is performed, a single power amplifier circuit amplifies transmission waves of multiple CCs. These multiple transmission waves pass through the same transmission filter and are radiated from an antenna via an antenna switch, a coupler, or the like.

When the above-described intra-band contiguous CA or intra-band non-contiguous CA (hereinafter, simply referred to as intra-band carrier aggregation or intra-band CA) is performed, multiple transmission waves pass through the single transmission filter provided in a signal path. In other words, the multiple transmission waves are transmitted to the antenna through the same signal path. The power amplifier circuit, the antenna switch, and the like are provided in the signal path in addition to the transmission filter. Such a power amplifier circuit, an antenna switch, or the like generally has a nonlinearity between input and output, so, when the multiple transmission waves are inputted to the power amplifier circuit, the antenna switch, or the like, a false signal caused by the intermodulation product of multiple frequencies (hereinafter, intermodulation distortion (IMD)) occurs.

For a band having a wide band width (for example, Band 41 or Band 42 of LTE), some of many IMDs having different frequencies may be included in a transmission band. Since these IMDs are included in the pass band of the transmission filter, the transmission filter is not able to remove IMDs included in the transmission band and allows the IMDs to pass therethrough as-is. Particularly, a third-order intermodulation distortion (IMD3) and a fifth-order intermodulation distortion (IMD5) that are low-order intermodulation distortions among IMDs are highly likely to be included in the pass band of the transmission filter. Such IMDs of frequencies that are included in the pass band of the transmission filter cannot be removed by the transmission filter, so there can be cases that do not satisfy a spectrum emission mask (SEM) or specifications that restrict spurious emission.

In consideration of IMD components, there is, for example, a technique called Additional Maximum Power Reduction (A-MPR) defined in Third Generation Partnership Project (3GPP) that is a standardization project for cellular phone systems as a control technique for reducing interference with an adjacent band or the like. This is a technique for executing control to intentionally decrease a transmission power such that a sufficient attenuation is obtained with respect to allowable interference level for an adjacent band; however, when the linearity of a power amplifier circuit is low, IMDs that are generated from the power amplifier circuit may be excessively large and, as a result, the specifications may not be satisfied even when A-MPR is fully used.

Japanese Unexamined Patent Application Publication No. 2016-063241 describes that, on the assumption of such a situation, the levels of IMD components are detected by using the coupler, and the transmission power of a transmission wave is decreased as needed. However, only the levels of IMD components having different frequencies need to be extracted and measured, and control over a transmission power is needed in conformity with transmission power control that is executed by a base station side, so complicated detection and calculation processes are needed.

BRIEF SUMMARY OF THE DISCLOSURE

Accordingly, it is an object of the present disclosure to provide a front-end circuit that is capable of reducing intermodulation distortions that are generated as a result of handling multiple transmission waves without a need of complicated control.

According to preferred embodiments of the present disclosure, a front-end circuit switches between an intra-band carrier aggregation mode in which multiple transmission waves having different frequency bands included in a single communication band are transmitted at a time and a single mode in which a transmission wave of one frequency band included in the single communication band is transmitted. A frequency component of part of multiple intermodulation distortions that are generated by the multiple transmission waves is included in the communication band in the intra-band carrier aggregation mode. The front-end circuit includes a power amplifier circuit configured to amplify power of the multiple transmission waves, a transmission filter provided in a signal path from the power amplifier circuit to an antenna and configured to pass a predetermined transmission frequency band of an output signal of the power amplifier circuit, a matching circuit, and a switch configured to switch according to the intra-band carrier aggregation mode or the single mode whether to connect the matching circuit to the signal path. The switch and the matching circuit are configured to increase an insertion loss in a frequency band of an intermodulation distortion within the communication band in the intra-band carrier aggregation mode as compared to an insertion loss in a frequency band of an intermodulation distortion within the communication band in the single mode.

The matching circuit is not limited to a circuit provided exclusively to switch the frequency characteristics of an insertion loss of the signal path. The matching circuit may be a circuit, such as a filter, a duplexer, and a multiplexer, not used when the carrier aggregation is performed.

With the above configuration, in the intra-band carrier aggregation mode, the impedance of the signal path between the antenna and the power amplifier circuit is mismatched for a frequency component of an intermodulation distortion of multiple transmission waves that are included in the pass band of the transmission filter, with the result that an insertion loss of the frequency component of the intermodulation distortion increases and the power of the intermodulation distortion to be transmitted from the antenna is suppressed.

Other features, elements, characteristics and advantages of the present disclosure will become more apparent from the following detailed description of preferred embodiments of the present disclosure with reference to the attached drawings.

DETAILED DESCRIPTION OF THE DISCLOSURE

Figure 1:
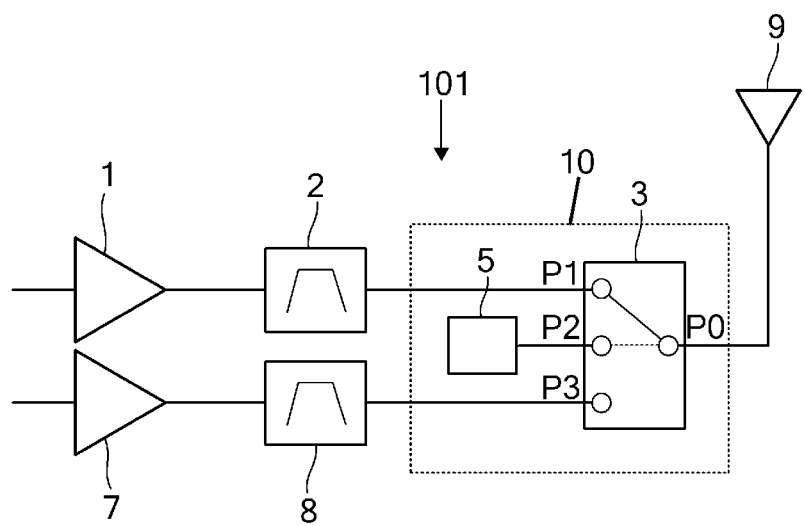
FIG. 1 is a block diagram of a front-end circuit 101 according to a first embodiment.

Hereinafter, a plurality of embodiments of the present disclosure will be described by using some specific examples with reference to the accompanying drawings. Like reference signs are assigned to the same portions in the drawings. In consideration of description of main points or easiness of understanding, embodiments are described separately for the sake of convenience of description; however, partial replacements or combinations of components described in different embodiments are possible. From a second embodiment, the description of similar matters to those of a first embodiment is omitted, and only the differences will be described. Particularly, similar operation and advantageous effects with similar components will not be repeated one by one for each embodiment.

First Embodiment

FIG. 1 is a block diagram of a front-end circuit 101 according to the first embodiment. FIG. 1 shows a circuit portion that selectively supplies multiple transmission waves having different transmission frequency bands to an antenna 9.

The front-end circuit 101 includes a power amplifier circuit 1 that amplifies the power of a transmission wave in a predetermined frequency band, a transmission filter 2 that passes a predetermined transmission frequency band of an output signal of the power amplifier circuit 1, a power amplifier circuit 7 that amplifies the power of a transmission wave in a predetermined frequency band, a transmission filter 8 that passes a predetermined transmission frequency band of an output signal of the power amplifier circuit 7, and an antenna switch 3 that selectively supplies output of the transmission filter 2 or the transmission filter 8 to the antenna 9. The front-end circuit 101 includes a matching circuit 5 connected to an input/output port P2 of the antenna switch 3.

The antenna switch 3 has an antenna port P0 and multiple input/output ports P1, P2, P3. When a transmission wave that is outputted from the transmission filter 2 is supplied to the antenna 9, the antenna switch 3 forms a signal path from the power amplifier circuit 1 to the antenna 9 by connecting the antenna port P0 and the input/output port P1. When a transmission wave that is outputted from the transmission filter 8 is supplied to the antenna 9, the antenna switch 3 connects the antenna port P0 and the input/output port P3. In addition, the antenna switch 3 is capable of connecting the antenna port P0 and the input/output port P1 and connecting the antenna port P0 and the input/output port P2. In other words, with this configuration, the front-end circuit 101 is capable of forming a signal path from the power amplifier circuit 1 to the antenna 9 and connecting the matching circuit 5 to the signal path.

The matching circuit 5 and the antenna switch 3 shown in FIG. 1 make up an additional matching circuit 10 to be added to the transmission filter 2. The additional matching circuit 10 is a circuit that switches the frequency characteristics of the insertion loss of the signal path by using whether the matching circuit 5 is connected by the antenna switch 3. The operation of the additional matching circuit 10 will be described in detail later and is schematically as follows.

First, in an intra-band carrier aggregation mode in which multiple transmission waves having different frequency bands included in a single communication band are transmitted at a time, transmission waves of two frequency bands are inputted to the power amplifier circuit 1. As a result, when an IMD component is included in the pass band of the transmission filter 2, the antenna switch 3 is connected to the matching circuit 5 to suppress the IMD component. In other words, in the intra-band carrier aggregation mode, the antenna switch 3 is controlled such that the antenna port P0 of the antenna switch 3 is connected to the input/output port P1 and the antenna port P0 is connected to the input/output port P2.

The state where the antenna port P0 and the input/output port P1 of the antenna switch 3 are connected and the antenna port P0 and the input/output port P2 are connected is a state where the matching circuit 5 is connected to the signal path from the power amplifier circuit 1 to the antenna 9. In this state, the matching circuit 5 intentionally mismatches the impedance of the signal path between the power amplifier circuit 1 and the antenna 9 at the frequencies of the IMD component. In other words, although the matching circuit is used as a name, the matching circuit is basically a circuit that is used for mismatching in this example. With this mismatching, the insertion loss of the signal path at the frequencies of the IMD increases, so the IMD component is suppressed. Even in a state where the matching circuit 5 is connected to the signal path from the power amplifier circuit 1 to the antenna 9, a matching state is maintained in a frequency band other than the frequencies of the IMD component.

On the other hand, in a single mode in which a transmission wave of one frequency band included in a single communication band is transmitted, that is, when intra-band CA is not performed and the transmission wave of the one frequency band is inputted to the power amplifier circuit 1, the antenna switch 3 is controlled such that only the antenna port P0 and the input/output port P1 of the antenna switch 3 are connected. In other words, in the single mode, the matching circuit 5 is not connected to the signal path from the power amplifier circuit 1 to the antenna 9. Therefore, impedance matching of the signal path is maintained.

As described above, with the configuration in which the matching circuit 5 is not connected to the signal path in the single mode and the matching circuit 5 is connected to the signal path in the intra-band carrier aggregation mode, the insertion loss in the single mode is easily reduced.

Conversely, the matching circuit 5 is controlled to be connected to the signal path from the power amplifier circuit 1 to the antenna 9 in the single mode, and the matching circuit 5 may be controlled not to be connected to the signal path from the power amplifier circuit 1 to the antenna 9 and the matching circuit 5 may be controlled to be isolated from the signal path in the intra-band carrier aggregation mode. In other words, in the single mode, the impedance of the signal path at the frequency of a transmission wave may be matched by connecting the matching circuit 5 to the signal path, and, in the intra-band carrier aggregation mode, the IMD component may be suppressed by not using the matching circuit 5 for mismatching to increase the insertion loss of the signal path at the frequencies of the IMD.

Figure 2A:
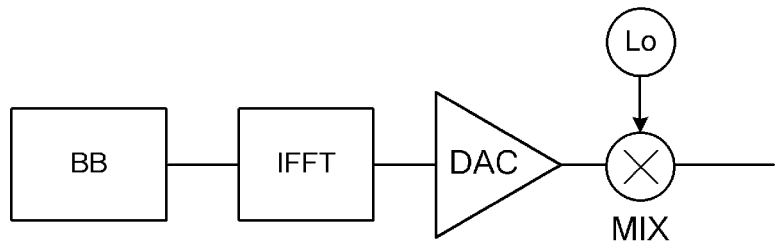
FIG. 2A, FIG. 2B, and FIG. 2C are block diagrams of examples of a transmission circuit that is connected to an input part of a power amplifier circuit 1 shown in FIG. 1.
Figure 2B:
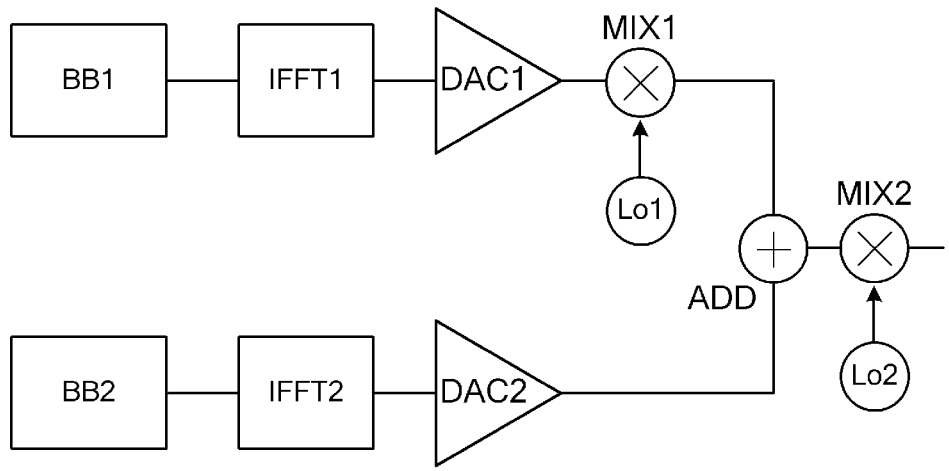
Figure 2C:
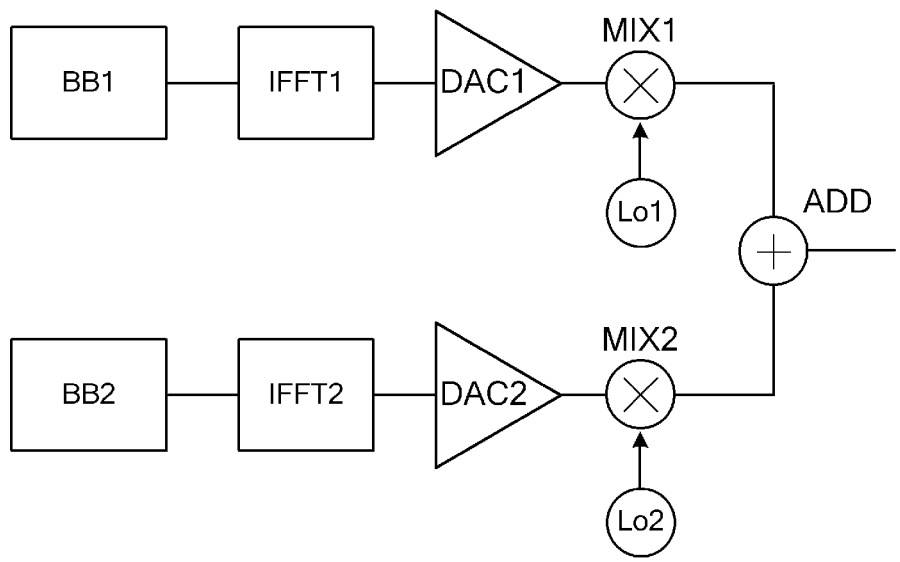

FIG. 2A, FIG. 2B, and FIG. 2C are block diagrams of examples of a transmission circuit that is connected to an input part of the power amplifier circuit 1 shown in FIG. 1.

The transmission circuit shown in FIG. 2A includes a baseband transmission signal circuit BB, an IFFT circuit IFFT that performs inverse Fourier transform on the baseband transmission signal, a D/A converter DAC that converts an inverse Fourier transformed signal to an analog signal, a local signal oscillator Lo, and a mixing circuit MIX that mixes an output signal of the D/A converter DAC with a local signal. When carrier aggregation is not performed and only a single transmission wave is transmitted, the transmission circuit as shown in FIG. 2A is used.

FIG. 2B and FIG. 2C are configuration examples of a transmission circuit in the intra-band carrier aggregation mode. In the example shown in FIG. 2B, the transmission circuit includes baseband transmission signal generation circuits BB1, BB2, IFFT circuits IFFT1, IFFT2 that respectively perform inverse Fourier transform on these baseband transmission signals, D/A converters DAC1, DAC2 that respectively convert inverse Fourier transformed signals to analog signals, local signal oscillators Lo1, Lo2, a mixing circuit MIX1 that mixes an output signal of the D/A converter DAC1 with an output signal of the local signal oscillator Lo1, an adder ADD that adds an output signal of the mixing circuit MIX1 and an output signal of the D/A converter DAC2, and a mixing circuit MIX2 that mixes an output signal of the adder ADD with an output signal of the local signal oscillator Lo2. In the example shown in FIG. 2C, the transmission circuit includes baseband transmission signal generation circuits BB1, BB2, IFFT circuits IFFT1, IFFT2 that respectively perform inverse Fourier transform on these baseband transmission signals, D/A converters DAC1, DAC2 that respectively convert inverse Fourier transformed signals to analog signals, local signal oscillators Lo1, Lo2, a mixing circuit MIX1 that mixes an output signal of the D/A converter DAC1 with an output signal of the local signal oscillator Lo1, a mixing circuit MIX2 that mixes an output signal of the D/A converter DAC2 with an output signal of the local signal oscillator Lo2, and an adder ADD that adds output signals of the mixing circuits MIX1, MIX2.

In FIG. 2B and FIG. 2C, for example, the baseband transmission signal generation circuit BB1 outputs a signal to be carried on a carrier Primary CC (PCC), and the baseband transmission signal generation circuit BB2 outputs a signal to be carried on a carrier Secondary CC (SCC).

In this way, in the intra-band carrier aggregation mode, two transmission waves are inputted to the power amplifier circuit 1 shown in FIG. 1.

Figure 3A:
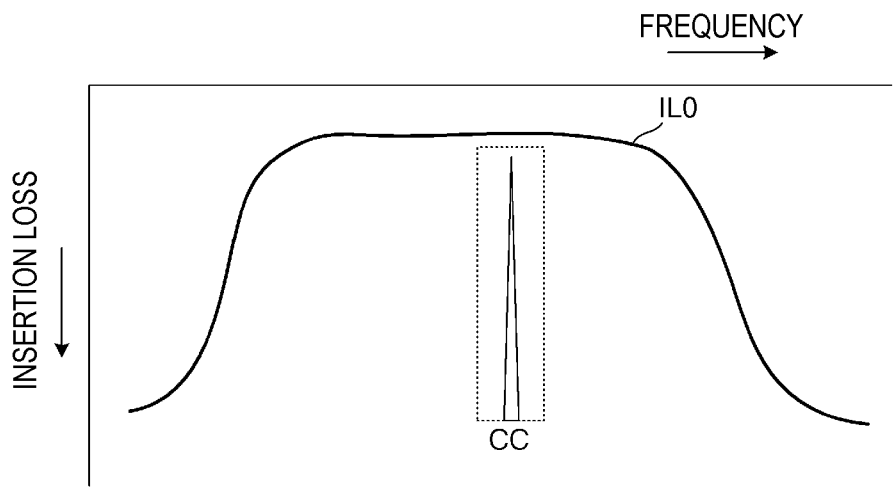
FIG. 3A is a graph showing the frequency characteristics of an insertion loss IL0 of a signal path from output of the power amplifier circuit 1 to an antenna port P0 of an antenna switch 3 and the spectrum of a component carrier CC in a single mode.

FIG. 3A is a graph showing the frequency characteristics of an insertion loss IL0 of the signal path from output of the power amplifier circuit 1 to the antenna port P0 of the antenna switch 3 and the spectrum of a component carrier CC when the antenna switch 3 shown in FIG. 1 connects the antenna port P0 to only the input/output port P1. The frequency characteristics of the insertion loss IL0 are equal to the frequency characteristics of the insertion loss of the transmission filter 2. In the single mode, one component carrier CC is transferred with a low insertion loss.

Figure 3B:
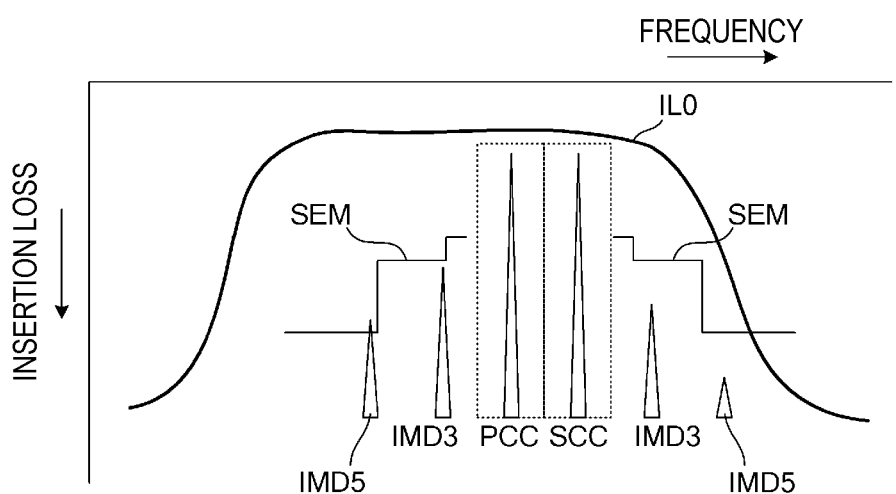
FIG. 3B and FIG. 3C are graphs showing the spectra of two component carriers PCC, SCC and the spectra of intermodulation distortions IMD3, IMD5 in an intra-band carrier aggregation mode.

FIG. 3B is a graph showing the spectra of two component carriers PCC, SCC and the spectra of intermodulation distortions IMD3, IMD5 in the intra-band carrier aggregation mode in a state where the antenna switch 3 shown in FIG. 1 connects the antenna port P0 to only the input/output port P1. In this example, of a large number of intermodulation distortions, the intermodulation distortions IMD3, IMD5 are included in the pass band of the transmission filter 2.

Figure 3C:
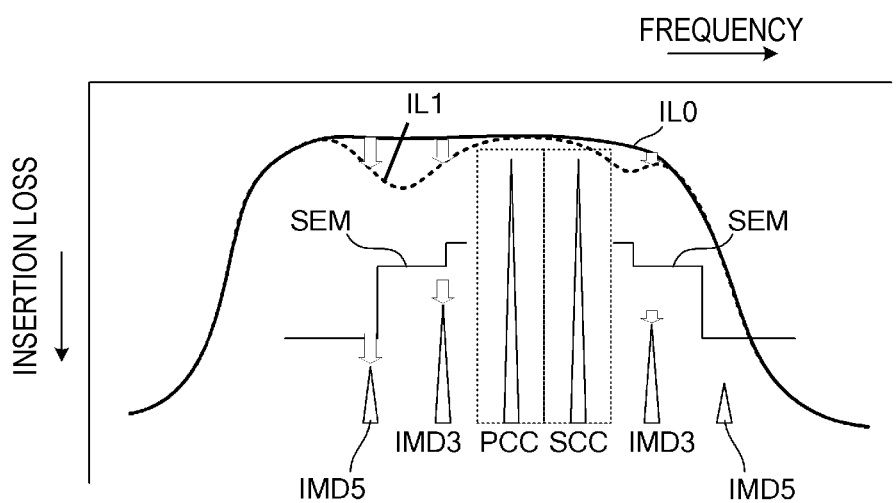

In FIG. 3B, the line indicated by SEM is an example of the specifications of a spectrum emission mask (SEM). In the example of FIG. 3B, the intermodulation distortion IMD5 that appears at frequencies lower than the two component carriers PCC, SCC exceeds the SEM line. This means that the specifications of the spectrum emission mask (SEM) are not satisfied in this state.

Where the frequency of the PCC is denoted by f0 and the frequency of the SCC is denoted by f1, of the two intermodulation distortions IMD3 in FIG. 3B and FIG. 3C, the frequency of the lower frequency-side IMD3 is (2f0−f1), and the frequency of the higher frequency-side IMD3 is (2f1−f0). In addition, of the two intermodulation distortions IMD5 in FIG. 3B and FIG. 3C, the frequency of the lower frequency-side IMD5 is (3f0−2f1), and the frequency of the higher frequency-side IMD5 is (3f1−2f0). Similarly, intermodulation distortions at the frequencies (4f0−3f1) and (4f1−3f0) and further higher-order intermodulation distortions also occur; however, the intermodulation distortions outside the pass band of the transmission filter are sufficiently attenuated by the transmission filter.

FIG. 3C, as in the example shown in FIG. 3B, is a graph showing the frequency characteristics of the insertion loss IL1 of the signal path from output of the power amplifier circuit 1 to the antenna port P0 of the antenna switch 3 and the spectra of two component carriers PCC, SCC and the spectra of intermodulation distortions IMD3, IMD5 in the intra-band carrier aggregation mode in a state where the antenna switch 3 shown in FIG. 1 connects the antenna port P0 to both the input/output ports P1 P2 on the condition that the intermodulation distortions IMD3, IMD5 are included in the pass band of the transmission filter 2. In FIG. 3C, the insertion loss IL0 shown in FIG. 3A and FIG. 3C is also shown in a superimposed manner.

The state where the antenna switch 3 shown in FIG. 1 connects the antenna port P0 to both the input/output ports P1, P2 is a state where the matching circuit 5 is connected to the signal path from the power amplifier circuit 1 to the antenna 9. Since the matching circuit 5 is a circuit that intentionally mismatches the impedance of the signal path between the power amplifier circuit 1 and the antenna 9, there occurs a ripple in the frequency characteristics of the insertion loss of the signal path from output of the power amplifier circuit 1 to the antenna port P0 of the antenna switch 3. In the example shown in FIG. 3C, while the matching circuit 5 is connected, attenuation ranges are respectively formed at frequencies higher than and frequencies lower than the frequency bands of the two component carriers PCC, SCC. In other words, the insertion loss in the frequency band including the intermodulation distortions IMD5, IMD3 that appear at frequencies lower than the two component carriers PCC, SCC is increased. Similarly, the insertion loss in the frequency band including the intermodulation distortions IMD5, IMD3 that appear at frequencies higher than the two component carriers PCC, SCC is increased. As a result, the intermodulation distortion IMD5 that appears at frequencies lower than the two component carriers PCC, SCC is lower than the SEM line and satisfies the specifications of the spectrum emission mask (SEM). In the example of FIG. 3C, the insertion loss in the frequency band including the intermodulation distortion IMD3 that appears at frequencies higher than the two component carriers PCC, SCC is increased.

In this way, in the intra-band carrier aggregation mode, with such characteristics that the matching circuit mismatches the impedance of the signal path for the frequency component of the intermodulation distortion included in the communication band, it is easy to effectively individually suppress an intermodulation distortion that appears in the pass band of the transmission filter.

A ripple that occurs in the frequency characteristics of the insertion loss when the antenna switch 3 shown in FIG. 1 selects the matching circuit 5 is known in advance. In other words, the circuit configuration of the matching circuit 5 may be determined such that the level of the intermodulation distortion satisfies the specification of the spectrum emission mask (SEM) when the antenna switch 3 selects the matching circuit 5.

With the present embodiment, in the intra-band carrier aggregation mode, the impedance of the signal path between the antenna and the power amplifier circuit is mismatched for a frequency component of an intermodulation distortion of multiple transmission waves included in the pass band of the transmission filter, with the result that the insertion loss of the frequency component of the intermodulation distortion increases and the power of the intermodulation distortion to be transmitted from the antenna is suppressed.

Needless to mention again, the spectra shown in FIG. 3A, FIG. 3B, and FIG. 3C (also spectra that will be described later) are examples. A transmission wave may use all the resource blocks (RBs) in one component carrier.

Figure 4:
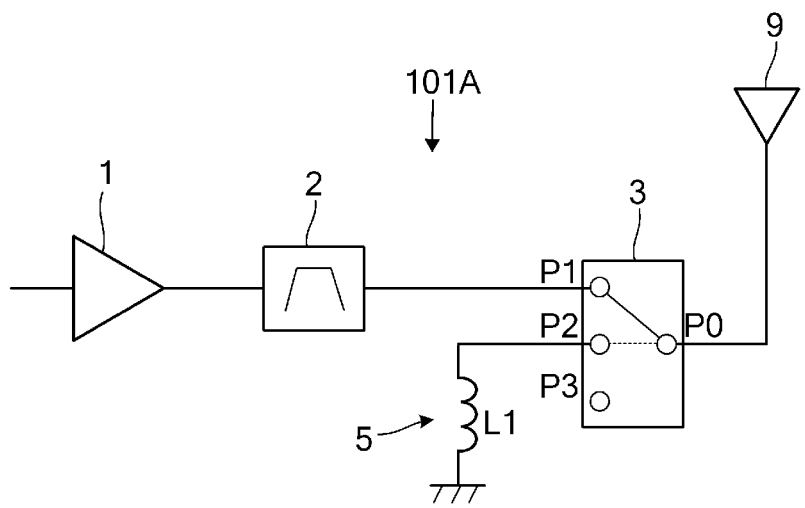
FIG. 4 is a block diagram of a front-end circuit 101A, including an example of a matching circuit 5.

FIG. 4 is a block diagram of a front-end circuit 101A, including an example of the matching circuit 5. In this example, the matching circuit 5 is composed of an inductor L1 connected between the input/output port P2 of the antenna switch 3 and a ground.

Figure 5:
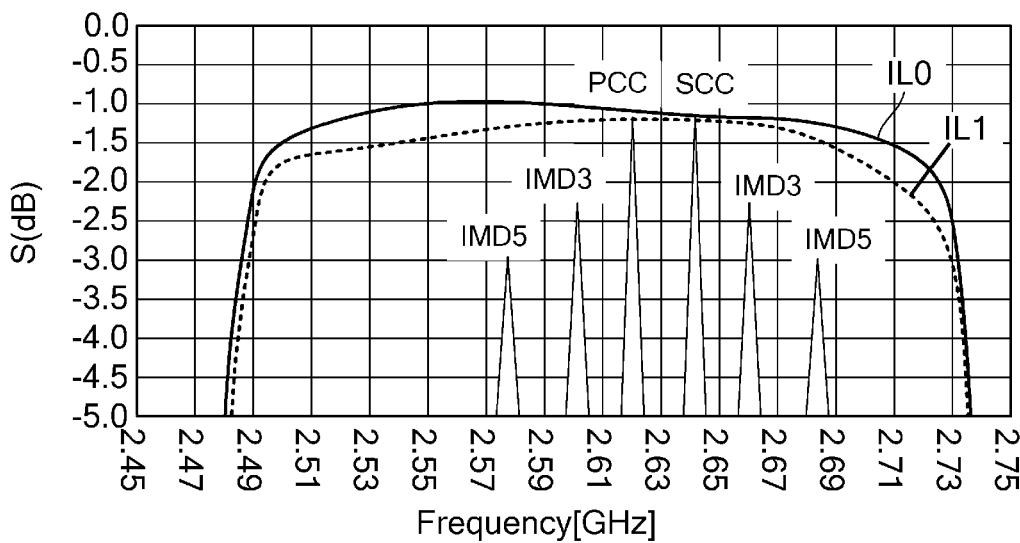
FIG. 5 is a graph showing the spectra of two component carriers PCC, SCC and the spectra of intermodulation distortions IMD3, IMD5 in the intra-band carrier aggregation mode in the front-end circuit 101A shown in FIG. 4.

FIG. 5 is a graph showing the spectra of two component carriers PCC, SCC and the spectra of intermodulation distortions IMD3, IMD5 in the intra-band carrier aggregation mode in the front-end circuit 101A shown in FIG. 4. In FIG. 5, the insertion loss IL0 is an insertion loss of the signal path from output of the power amplifier circuit 1 to the antenna port P0 of the antenna switch 3 in a state where the antenna switch 3 connects the antenna port P0 to only the input/output port P1. In addition, the insertion loss IL1 is an insertion loss of the signal path from output of the power amplifier circuit 1 to the antenna port P0 of the antenna switch 3 in a state where the antenna switch 3 connects the antenna port P0 to both the input/output ports P1, P2.

In the example shown in FIG. 5, the PCC is at about 2620 MHz, the SCC is at about 2640 MHz, and the IMD3 at about 2600 MHz and the IMD3 at about 2660 MHz are decreased by about 0.3 dB. In addition, the IMD5 at about 2580 MHz and the IMD5 at about 2680 MHz are decreased by about 0.5 dB.

In this way, in the intra-band carrier aggregation mode, the matching circuit forms an attenuation range at frequencies higher than or lower than the frequency bands of the multiple transmission waves. With such characteristics, it is easy to suppress many intermodulation distortion components such as IMD3 and IMD5 that appear on both sides of the two component carriers PCC, SCC.

Figure 6:
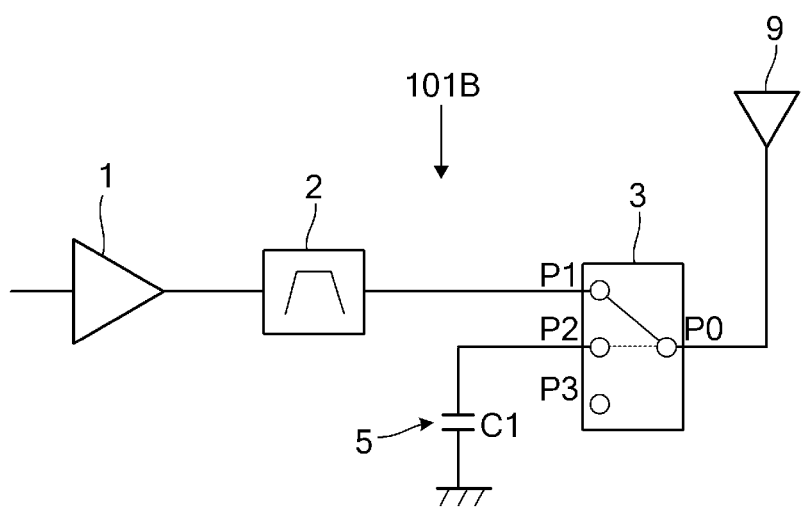
FIG. 6 is a block diagram of a front-end circuit 101B, including another example of the matching circuit 5.

FIG. 6 is a block diagram of a front-end circuit 101B, including an example of the matching circuit 5. In this example, the matching circuit 5 is composed of a capacitor C1 connected between the input/output port P2 of the antenna switch 3 and the ground.

Figure 7:
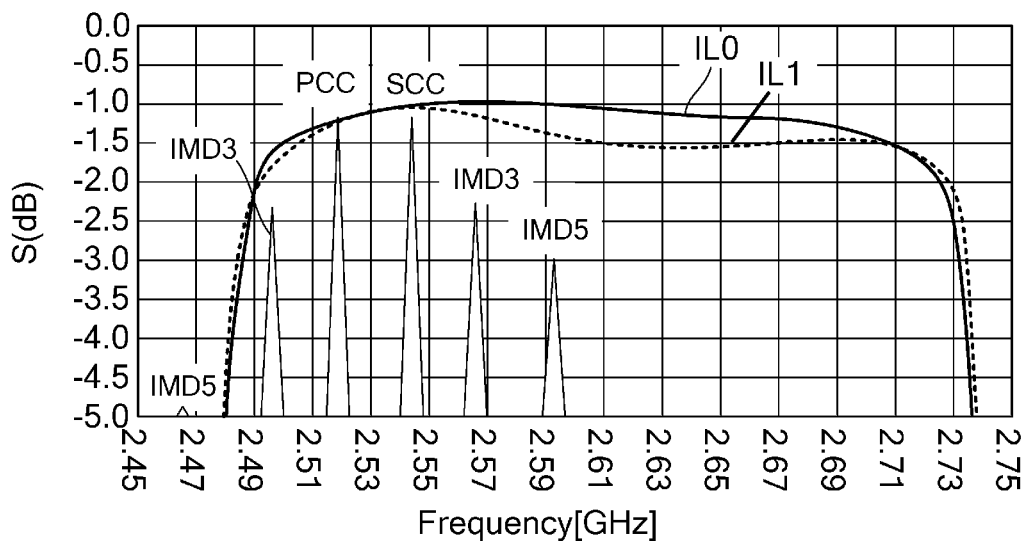
FIG. 7 is a graph showing the spectra of two component carriers PCC, SCC and the spectra of intermodulation distortions IMD3, IMD5 in the intra-band carrier aggregation mode in the front-end circuit 101B shown in FIG. 6.

FIG. 7 is a graph showing the spectra of two component carriers PCC, SCC and the spectra of intermodulation distortions IMD3, IMD5 in the intra-band carrier aggregation mode in the front-end circuit 101B shown in FIG. 6. In FIG. 7, the insertion loss IL0 is an insertion loss of the signal path from output of the power amplifier circuit 1 to the antenna port P0 of the antenna switch 3 in a state where the antenna switch 3 connects the antenna port P0 to only the input/output port P1. In addition, the insertion loss IL1 is an insertion loss of the signal path from output of the power amplifier circuit 1 to the antenna port P0 of the antenna switch 3 in a state where the antenna switch 3 connects the antenna port P0 to both the input/output ports P1, P2.

In the example shown in FIG. 7, the PCC is at about 2520 MHz, the SCC is at about 2540 MHz, and the IMD3 at about 2500 MHz and the IMD3 at about 2560 MHz are decreased by about 0.2 dB. In addition, the IMD5 at about 2590 MHz is decreased by about 0.4 dB.

As described above, in the single mode, the impedance of the signal path may be matched at the frequency of a transmission wave by connecting the matching circuit 5 to the signal path, and, in the intra-band carrier aggregation mode, the IMD component may be suppressed by not using the matching circuit 5 for mismatching to increase the insertion loss of the signal path at the frequencies of the IMD.

Second Embodiment

In a second embodiment, a front-end circuit in which the configuration of a transmission filter and the configuration of a matching circuit are different from those described in the first embodiment will be described.

Figure 8:
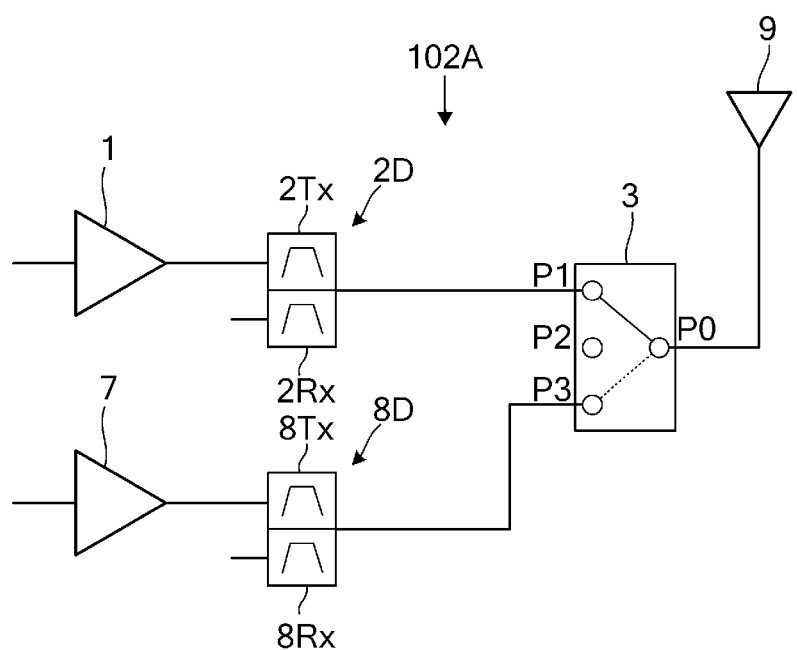
FIG. 8 is a block diagram of a front-end circuit 102A according to a second embodiment.

FIG. 8 is a block diagram of a front-end circuit 102A according to the second embodiment. The front-end circuit 102A includes the power amplifier circuit 1 that amplifies the power of a transmission wave in a predetermined frequency band, a duplexer 2D that passes a predetermined transmission frequency band of an output signal of the power amplifier circuit 1, a duplexer 8D that passes a transmission wave and a reception wave in a predetermined frequency band, and the antenna switch 3 that selectively connects the duplexers 2D, 8D to the antenna 9.

The duplexer 2D includes a transmission filter 2Tx and a receiving filter 2Rx. Similarly, the duplexer 8D includes a transmission filter 8Tx and a receiving filter 8Rx. In the present embodiment, the transmission filter 2Tx corresponds to the transmission filter according to the present disclosure. The duplexer 8D corresponds to the matching circuit according to the present disclosure.

In FIG. 8, when the antenna port P0 and the input/output port P1 are connected, the signal path from the power amplifier circuit 1 to the antenna 9 is formed. When the antenna port P0 and the input/output port P1 are connected and the antenna port P0 and the input/output port P3 are connected, the front-end circuit 102A forms the signal path from the power amplifier circuit 1 to the antenna 9 and connects the duplexer 8D serving as a matching circuit to the signal path.

Figure 9:
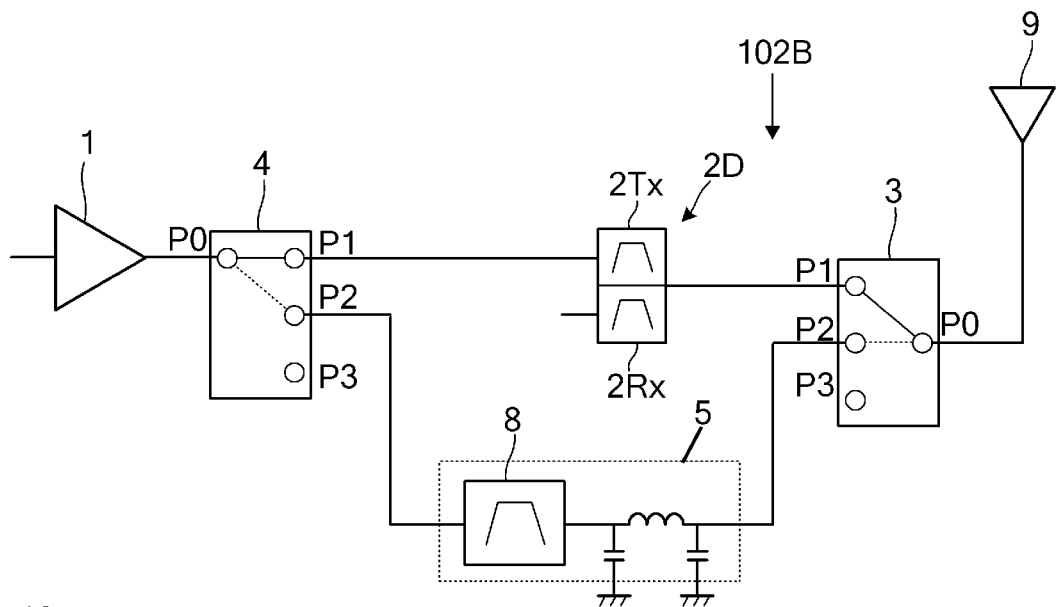
FIG. 9 is a block diagram of another front-end circuit 102B according to the second embodiment.

FIG. 9 is a block diagram of another front-end circuit 102B according to the second embodiment. The front-end circuit 102B includes the power amplifier circuit 1 that amplifies the power of a transmission wave in a predetermined frequency band, a transmission wave select switch 4 that bifurcates a transmission wave outputted from the power amplifier circuit 1 into multiple signal paths, the duplexer 2D that passes a predetermined transmission frequency band, the transmission filter 8 that passes a predetermined transmission frequency band of a transmission wave outputted from the power amplifier circuit 1, and the antenna switch 3 that selectively supplies outputs of the duplexer 2D and the transmission filter 8 to the antenna 9. A matching circuit composed of a π-type CLC circuit including two capacitors and an inductor is connected between the transmission filter 8 and the antenna switch 3.

In the intra-band carrier aggregation mode in which the pass band of the transmission filter 2Tx of the duplexer 2D is used, the transmission wave select switch 4 opens the input/output port P2. In the intra-band carrier aggregation mode in which the pass band of the duplexer 2D is used, the transmission filter 8 and the 7c-type CLC circuit compose the matching circuit 5.

Figure 10:
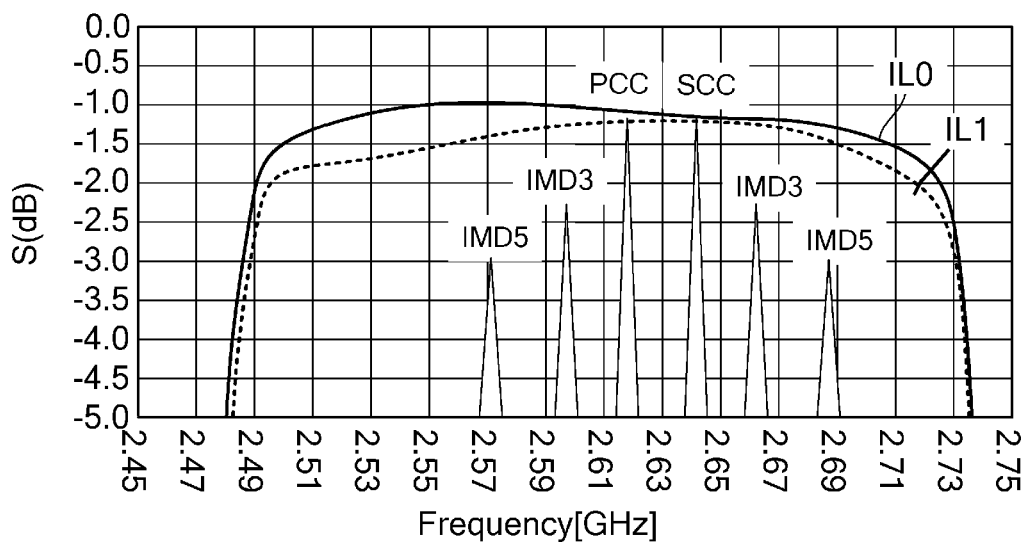
FIG. 10 is a graph showing the spectra of two component carriers PCC, SCC and the spectra of intermodulation distortions IMD3, IMD5 in the intra-band carrier aggregation mode in the front-end circuit 102B shown in FIG. 9.

FIG. 10 is a graph showing the spectra of two component carriers PCC, SCC and the spectra of intermodulation distortions IMD3, IMD5 in the intra-band carrier aggregation mode in the front-end circuit 102B shown in FIG. 9. In FIG. 10, the insertion loss IL0 is an insertion loss of the signal path from output of the power amplifier circuit 1 to the antenna port P0 of the antenna switch 3 in a state where the antenna switch 3 connects the antenna port P0 to only the input/output port P1. In addition, the insertion loss IL1 is an insertion loss of the signal path from output of the power amplifier circuit 1 to the antenna port P0 of the antenna switch 3 in a state where the antenna switch 3 connects the antenna port P0 to both the input/output ports P1, P2.

In the example shown in FIG. 10, as compared to the insertion loss IL0, the insertion loss IL1 is increased at frequencies lower than and frequencies higher than two component carriers PCC, SCC. With this configuration, the transmitting powers of the intermodulation distortions IMD3, IMD5 are suppressed.

Figure 11:
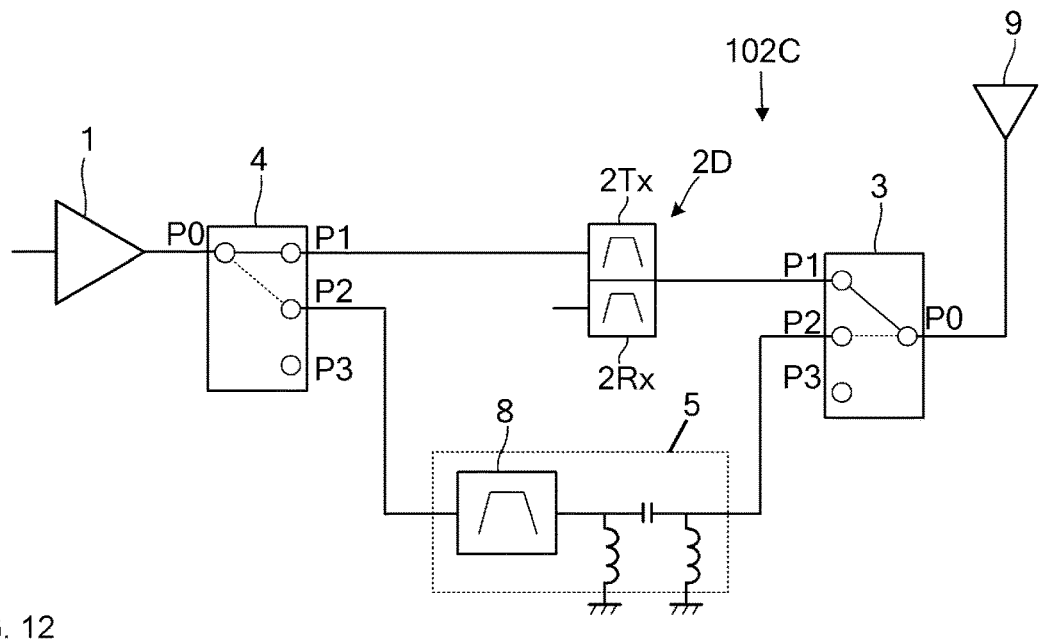
FIG. 11 is a block diagram of still another front-end circuit 102C according to the second embodiment.

FIG. 11 is a block diagram of still another front-end circuit 102C according to the second embodiment. The front-end circuit 102C includes the power amplifier circuit 1 that amplifies the power of a transmission wave in a predetermined frequency band, the transmission wave select switch 4 that bifurcates a transmission wave outputted from the power amplifier circuit 1 into multiple signal paths, the duplexer 2D that passes a predetermined transmission frequency band, the transmission filter 8 that passes a predetermined transmission frequency band of a transmission wave outputted from the power amplifier circuit 1, and the antenna switch 3 that selectively supplies outputs of the duplexer 2D and the transmission filter 8 to the antenna 9. A matching circuit composed of a π-type LCL circuit including two inductors and a capacitor is connected between the transmission filter 8 and the antenna switch 3.

In the intra-band carrier aggregation mode in which the pass band of the transmission filter 2Tx of the duplexer 2D is used, the transmission wave select switch 4 opens the input/output port P2. In the intra-band carrier aggregation mode in which the pass band of the duplexer 2D is used, the transmission filter 8 and the 7c-type LCL circuit compose the matching circuit 5.

Figure 12:
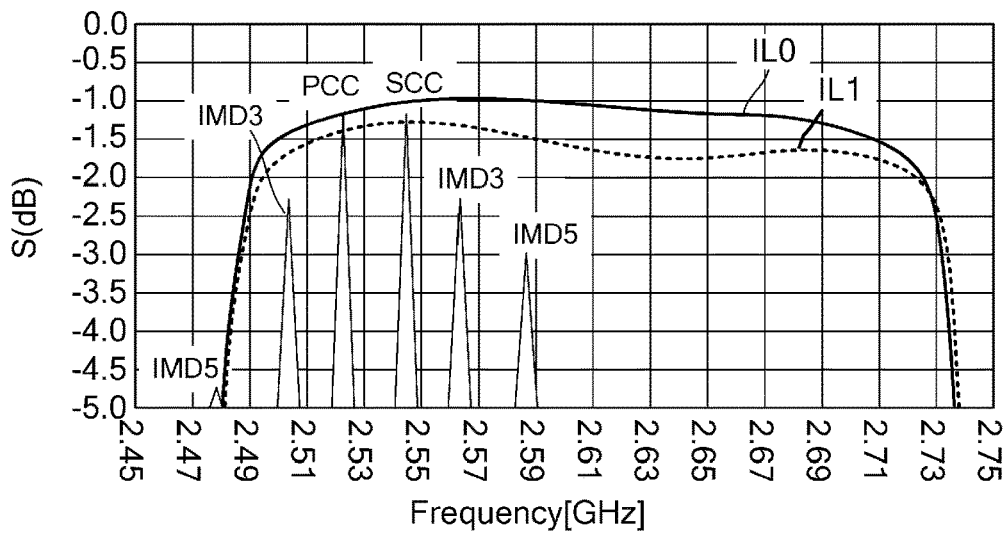
FIG. 12 is a graph showing the spectra of two component carriers PCC, SCC and the spectra of intermodulation distortions IMD3, IMD5 in the intra-band carrier aggregation mode in the front-end circuit 102C shown in FIG. 11.

FIG. 12 is a graph showing the spectra of two component carriers PCC, SCC and the spectra of intermodulation distortions IMD3, IMD5 in the intra-band carrier aggregation mode in the front-end circuit 102C shown in FIG. 11. In FIG. 12, the insertion loss IL0 is an insertion loss of the signal path from output of the power amplifier circuit 1 to the antenna port P0 of the antenna switch 3 in a state where the antenna switch 3 connects the antenna port P0 to only the input/output port P1. In addition, the insertion loss IL1 is an insertion loss of the signal path from output of the power amplifier circuit 1 to the antenna port P0 of the antenna switch 3 in a state where the antenna switch 3 connects the antenna port P0 to both the input/output ports P1, P2.

In the example shown in FIG. 12, as compared to the insertion loss IL0, the insertion loss IL1 is increased at frequencies lower than and frequencies higher than two component carriers PCC, SCC. With this configuration, the transmitting powers of the intermodulation distortions IMD3, IMD5 are suppressed.

Third Embodiment

In a third embodiment, an example of a front-end circuit including an additional matching circuit having a configuration different from that of the additional matching circuits shown in the first and second embodiments will be described.

Figure 13:
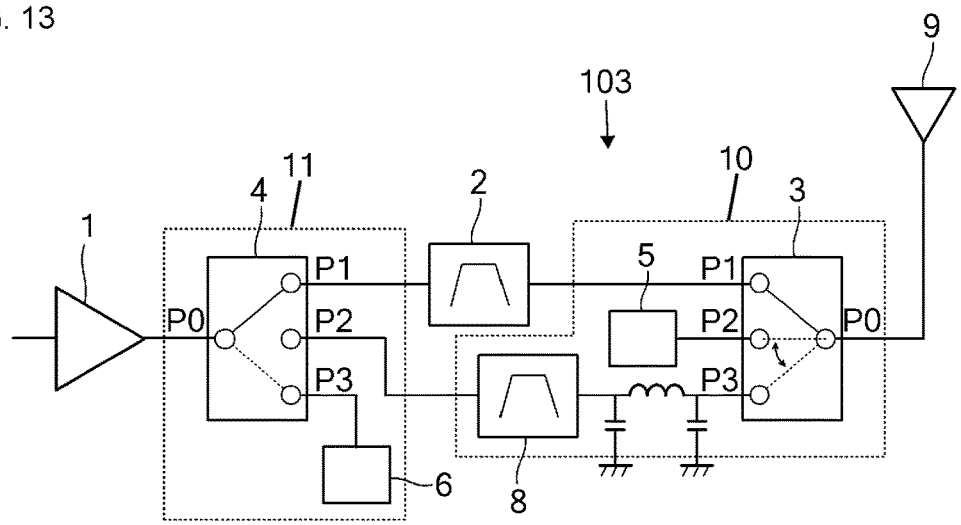
FIG. 13 is a block diagram of a front-end circuit 103 according to a third embodiment.

FIG. 13 is a block diagram of a front-end circuit 103 according to the third embodiment.

The front-end circuit 103 includes the power amplifier circuit 1 that amplifies the power of a transmission wave in a predetermined frequency band, the transmission wave select switch 4 that bifurcates a transmission wave outputted from the power amplifier circuit 1 into multiple signal paths, the transmission filter 2 that passes a predetermined transmission frequency band, the transmission filter 8 that passes a predetermined transmission frequency band of a transmission wave outputted from the power amplifier circuit 1, and the antenna switch 3 that selectively supplies outputs of the transmission filters 2, 8 to the antenna 9. A matching circuit composed of a π-type CLC circuit including two capacitors and an inductor is connected between the transmission filter 8 and the antenna switch 3. The matching circuit is an impedance matching circuit between the transmission filter 8 and the antenna switch 3.

The matching circuit 5, the transmission filter 8, the matching circuit composed of the 7c-type CLC circuit, and the antenna switch 3 compose an additional matching circuit 10. The front-end circuit 103 also includes the matching circuit 5 connected to the input/output port P2 of the antenna switch 3, and a matching circuit 6 connected to an input/output port P3 of the transmission wave select switch 4. The matching circuit 6 and the transmission wave select switch 4 compose an additional matching circuit 11.

The antenna switch 3 has the antenna port P0 and the multiple input/output ports P1, P2, P3. When a transmission wave that is outputted from the transmission filter 2 is supplied to the antenna 9, the antenna switch 3 connects the antenna port P0 to the input/output port P1. When a transmission wave that is outputted from the transmission filter 8 is supplied to the antenna 9, the antenna switch 3 connects the antenna port P0 to the input/output port P3. Furthermore, when the antenna switch 3 connects the antenna port P0 to the input/output port P1 and connects the antenna port P0 to the input/output port P2, the antenna switch 3 connects the matching circuit 5 to the signal path from the power amplifier circuit 1 to the antenna 9.

The transmission wave select switch 4 has a common port P0 and multiple input/output ports P1, P2, P3. When a transmission wave that is outputted from the power amplifier circuit 1 is supplied to the transmission filter 2, the transmission wave select switch 4 connects the common port P0 to the input/output port P1. When a transmission wave that is outputted from the power amplifier circuit 1 is supplied to the transmission filter 8, the transmission wave select switch 4 connects the common port P0 to the input/output port P2. Furthermore, when the transmission wave select switch 4 connects the common port P0 to the input/output port P1 and connects the common port P0 to the input/output port P3, the transmission wave select switch 4 connects the matching circuit 6 to the signal path from the power amplifier circuit 1 to the antenna 9.

In the front-end circuit 103 shown in FIG. 13, not only the matching circuit 5 but also the transmission filter 8 serves as a matching circuit. In other words, when the antenna switch 3 selects the transmission filter 8 in a state where the transmission wave select switch 4 is not selecting the input/output port P2, the transmission filter 8 is connected to the signal path from the power amplifier circuit 1 to the antenna 9. With this configuration, the impedance of the signal path is intentionally mismatched.

In the example shown in FIG. 13, the transmission filter 8 is also used as a matching circuit other than the matching circuit 5; however, not a transmission filter but a duplexer or a multiplexer may be used as a matching circuit other than the matching circuit 5.

Figure 14:
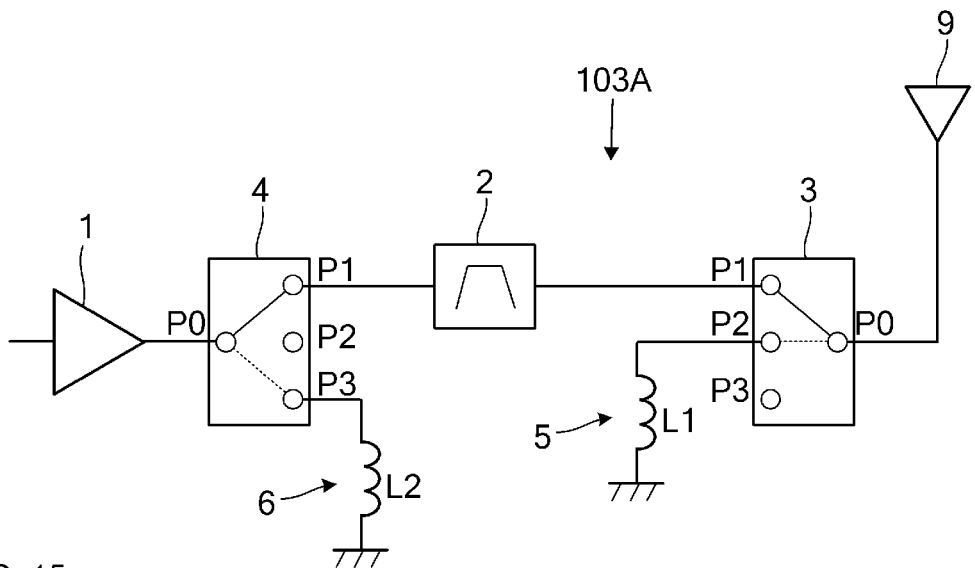
FIG. 14 is a block diagram of a front-end circuit 103A, including examples of matching circuits 5, 6.

FIG. 14 is a block diagram of a front-end circuit 103A, including examples of the matching circuits 5, 6. In this example, the matching circuit 5 is composed of an inductor L1 connected between the input/output port P2 of the antenna switch 3 and the ground. The matching circuit 6 is composed of an inductor L2 connected between the input/output port P3 of the transmission wave select switch 4 and the ground.

Figure 15:
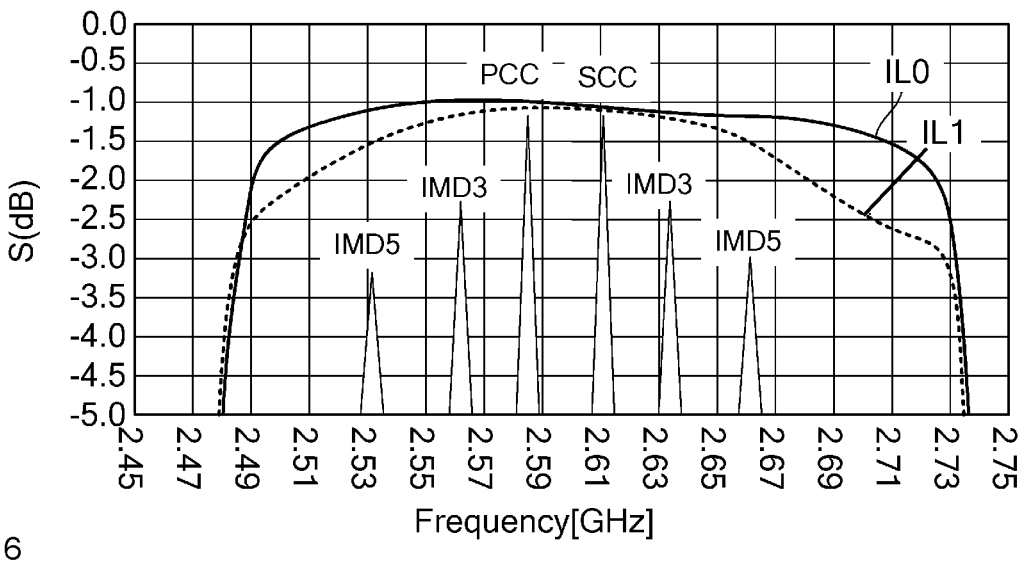
FIG. 15 is a graph showing the spectra of two component carriers PCC, SCC and the spectra of intermodulation distortions IMD3, IMD5 in the intra-band carrier aggregation mode in the front-end circuit 103A shown in FIG. 14.

FIG. 15 is a graph showing the spectra of two component carriers PCC, SCC and the spectra of intermodulation distortions IMD3, IMD5 in the intra-band carrier aggregation mode in the front-end circuit 103A shown in FIG. 14. In FIG. 15, the insertion loss IL0 is an insertion loss of the signal path from output of the power amplifier circuit 1 to the antenna port P0 of the antenna switch 3 in a state where the antenna switch 3 connects the antenna port P0 to only the input/output port P1 and the transmission wave select switch 4 connects the common port P0 to only the input/output port P1. The insertion loss IL1 is an insertion loss of the signal path from output of the power amplifier circuit 1 to the antenna port P0 of the antenna switch 3 in a state where the antenna switch 3 connects the antenna port P0 to both the input/output ports P1, P2 and the transmission wave select switch 4 connects the common port P0 to both the input/output ports P1, P3.

In the example shown in FIG. 15, as compared to the insertion loss IL0, the insertion loss IL1 is significantly increased at frequencies lower than and frequencies higher than two component carriers PCC, SCC. With this configuration, the transmitting powers of the intermodulation distortions IMD3, IMD5 are sufficiently suppressed.

Figure 16:
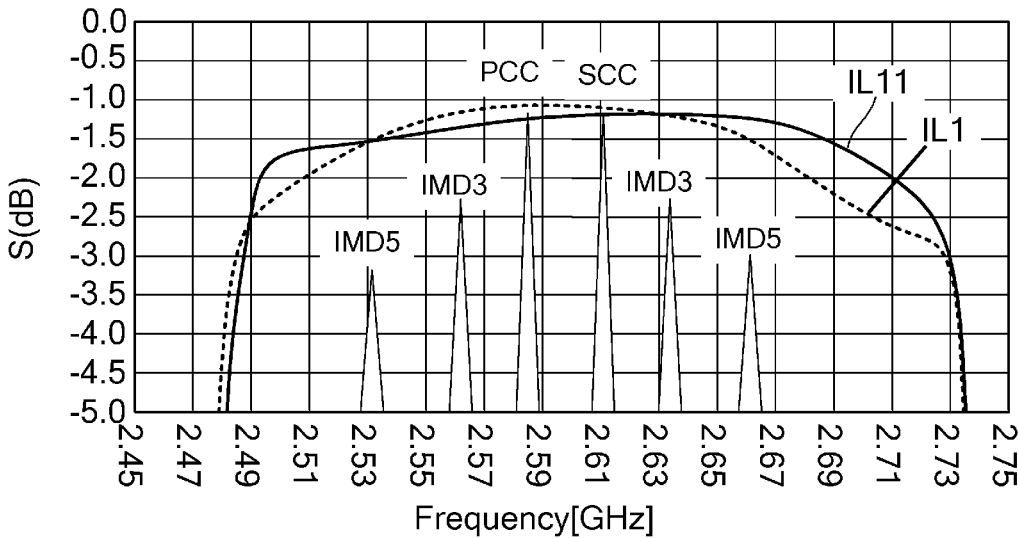
FIG. 16 is a graph for comparison between the characteristics of the front-end circuit 103A of the third embodiment and the characteristics of the front-end circuit 101A shown in the first embodiment.

FIG. 16 is a graph for comparison between the characteristics of the front-end circuit 103A of the present embodiment and the characteristics of the front-end circuit 101A shown in the first embodiment. In FIG. 16, the insertion loss IL1 is the same as the insertion loss IL1 shown in FIG. 15, and an insertion loss IL11 is the same as the insertion loss IL1 shown in FIG. 5.

In this way, not only the matching circuit 5 shown in FIG. 14 but also the matching circuit 6 is added, so it is possible to further increase the insertion loss at frequencies lower than and frequencies higher than the two component carriers PCC, SCC.

As shown in FIG. 16, the insertion loss is reduced at the frequencies of the two component carriers PCC, SCC in the intra-band carrier aggregation mode. In this way, by connecting the matching circuits, it is possible to provide such a configuration that not only the insertion loss in the frequency bands of intermodulation distortions is increased but also the insertion loss in the frequency bands of component carriers is reduced.

Figure 17:
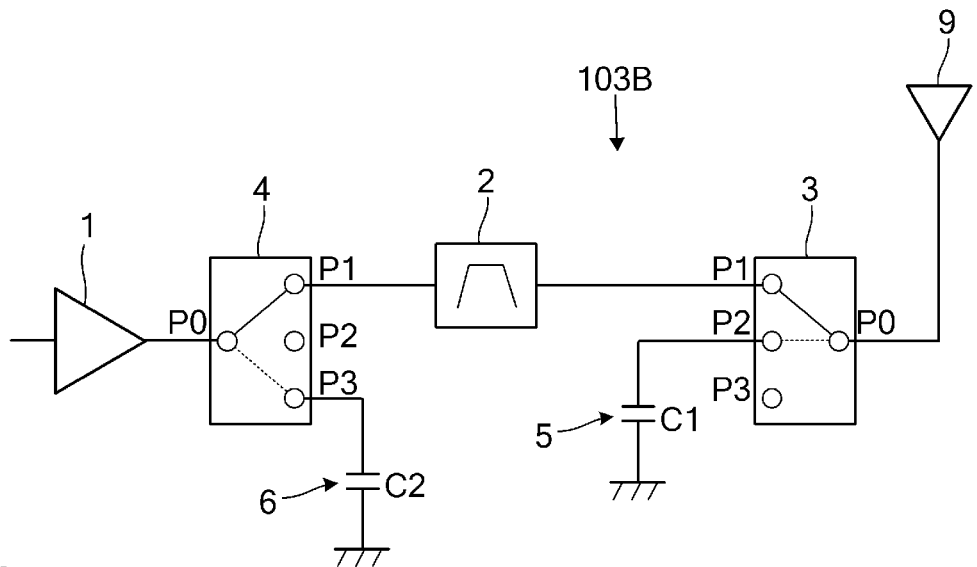
FIG. 17 is a block diagram of a front-end circuit 103B, including other examples of the matching circuits 5, 6.

FIG. 17 is a block diagram of a front-end circuit 103B, including other examples of the matching circuits 5, 6. In this example, the matching circuit 5 is composed of a capacitor C1 connected between the input/output port P2 of the antenna switch 3 and the ground. The matching circuit 6 is composed of a capacitor C2 connected between the input/output port P3 of the transmission wave select switch 4 and the ground.

Figure 18:
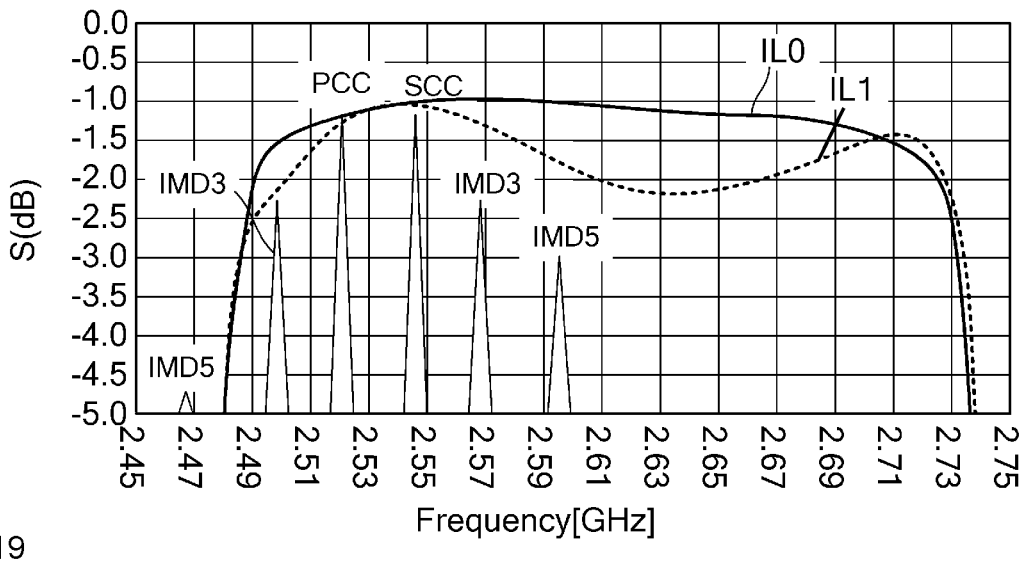
FIG. 18 is a graph showing the spectra of two component carriers PCC, SCC and the spectra of intermodulation distortions IMD3, IMD5 in the intra-band carrier aggregation mode in the front-end circuit 103B shown in FIG. 17.

FIG. 18 is a graph showing the spectra of two component carriers PCC, SCC and the spectra of intermodulation distortions IMD3, IMD5 in the intra-band carrier aggregation mode in the front-end circuit 103B shown in FIG. 17. In FIG. 18, the insertion loss IL0 is an insertion loss of the signal path from output of the power amplifier circuit 1 to the antenna port P0 of the antenna switch 3 in a state where the antenna switch 3 connects the antenna port P0 to only the input/output port P1 and the transmission wave select switch 4 connects the common port P0 to only the input/output port P1. The insertion loss IL1 is an insertion loss of the signal path from output of the power amplifier circuit 1 to the antenna port P0 of the antenna switch 3 in a state where the antenna switch 3 connects the antenna port P0 to both the input/output ports P1, P2 and the transmission wave select switch 4 connects the common port P0 to both the input/output ports P1, P3.

In the example shown in FIG. 18, as compared to the insertion loss IL0, the insertion loss IL1 is significantly increased at frequencies lower than and frequencies higher than two component carriers PCC, SCC. With this configuration, the transmitting powers of the intermodulation distortions IMD3, IMD5 are sufficiently suppressed.

Fourth Embodiment

In a fourth embodiment, an example of a front-end circuit including an additional matching circuit having a configuration different from that of the additional matching circuits shown in the embodiments described above will be described.

Figure 19:
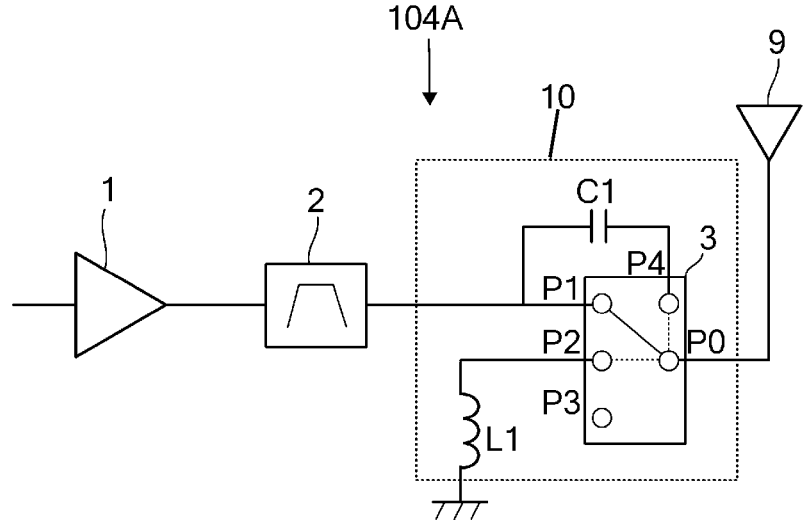
FIG. 19 is a block diagram of a front-end circuit 104A according to a fourth embodiment.

FIG. 19 is a block diagram of a front-end circuit 104A according to the fourth embodiment. In this example, the additional matching circuit 10 is composed of the inductor L1 connected between the input/output port P2 of the antenna switch 3 and the ground, the capacitor C1 connected between the input/output port P1 of the antenna switch 3 and an input/output port P4, and the antenna switch 3.

In the single mode, the antenna switch 3 connects the antenna port P0 to only the input/output port P1. In the intra-band carrier aggregation mode, the antenna switch 3 does not connect the antenna port P0 to the input/output port P1 and connects the antenna port P0 to both the input/output ports P2, P4.

Therefore, in the intra-band carrier aggregation mode, the capacitor C1 is inserted in series with the signal path for a transmission wave, and the inductor L1 is connected in shunt between the signal path and the ground.

Figure 20:
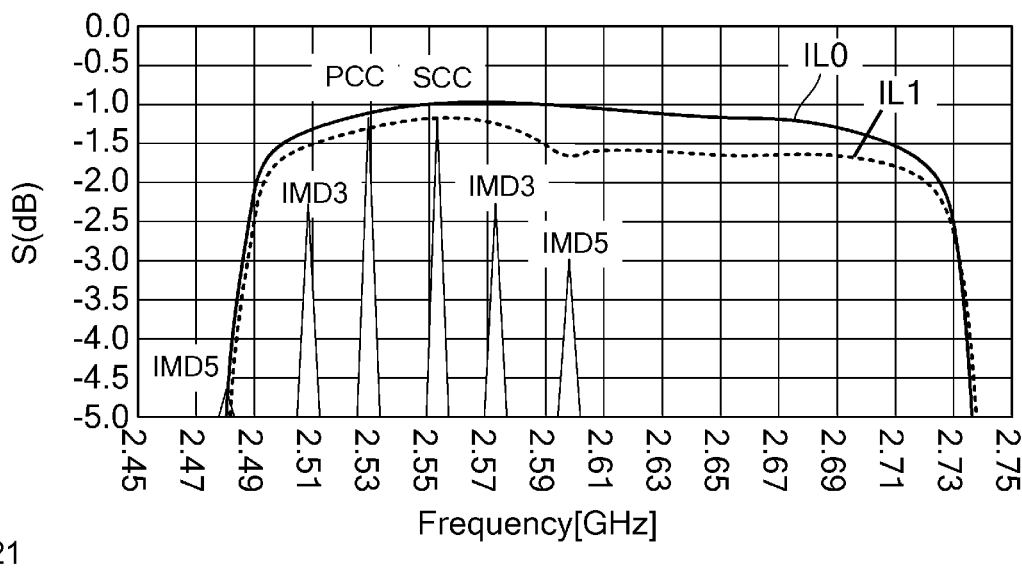
FIG. 20 is a graph showing the spectra of two component carriers PCC, SCC and the spectra of intermodulation distortions IMD3, IMD5 in the intra-band carrier aggregation mode in the front-end circuit 104A shown in FIG. 19.

FIG. 20 is a graph showing the spectra of two component carriers PCC, SCC and the spectra of intermodulation distortions IMD3, IMD5 in the intra-band carrier aggregation mode in the front-end circuit 104A shown in FIG. 19. In FIG. 20, the insertion loss IL0 is an insertion loss of the signal path from output of the power amplifier circuit 1 to the antenna port P0 of the antenna switch 3 in a state where the antenna switch 3 connects the antenna port P0 to only the input/output port P1. In addition, the insertion loss IL1 is an insertion loss of the signal path from output of the power amplifier circuit 1 to the antenna port P0 of the antenna switch 3 in a state where the antenna switch 3 connects the antenna port P0 to the input/output ports P2, P4.

In the example shown in FIG. 20, as compared to the insertion loss IL0, the insertion loss IL1 is increased at frequencies lower than and frequencies higher than two component carriers PCC, SCC. With this configuration, the transmitting powers of the intermodulation distortions IMD3, IMD5 are sufficiently suppressed.

Figure 21:
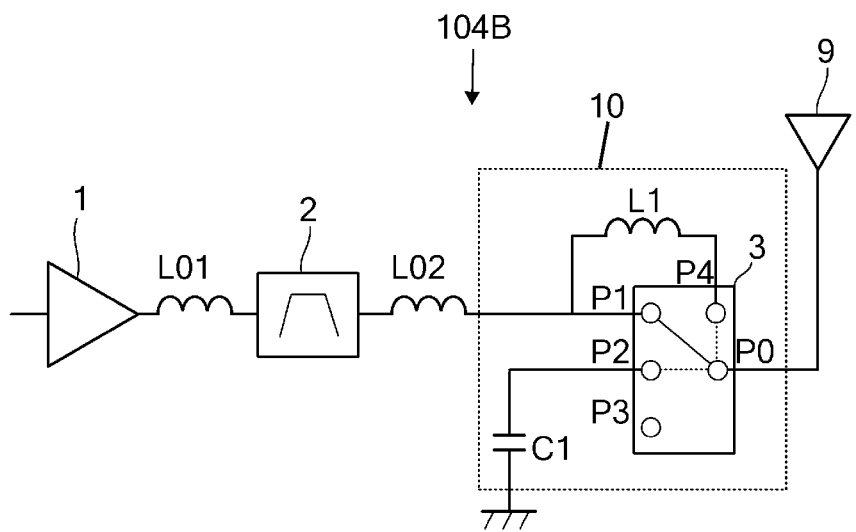
FIG. 21 is a block diagram of another front-end circuit 104B according to the fourth embodiment.

FIG. 21 is a block diagram of another front-end circuit 104B according to the fourth embodiment. In this example, the additional matching circuit 10 is composed of the capacitor C1 connected between the input/output port P2 of the antenna switch 3 and the ground, the inductor L1 connected between the input/output port P1 and the input/output port P4 of the antenna switch 3, and the antenna switch 3.

In the single mode, the antenna switch 3 connects the antenna port P0 to only the input/output port P1. In the intra-band carrier aggregation mode, the antenna switch 3 does not connect the antenna port P0 to the input/output port P1 and connects the antenna port P0 to both the input/output ports P2, P4.

Therefore, in the intra-band carrier aggregation mode, the inductor L1 is inserted in series with the signal path for a transmission wave, and the capacitor C1 is connected in shunt between the signal path and the ground.

In the example shown in FIG. 21, an inductor LO1 is inserted on a preceding side of the transmission filter 2, and an inductor L02 is inserted on a subsequent side of the transmission filter 2. The inductors LO1, L02 perform impedance matching in a frequency band of a component carrier that is outputted from the power amplifier circuit 1.

Fifth Embodiment

In a fifth embodiment, a front-end circuit in which the configurations of matching circuits are different from those described in the above embodiments will be described.

Figure 22A:
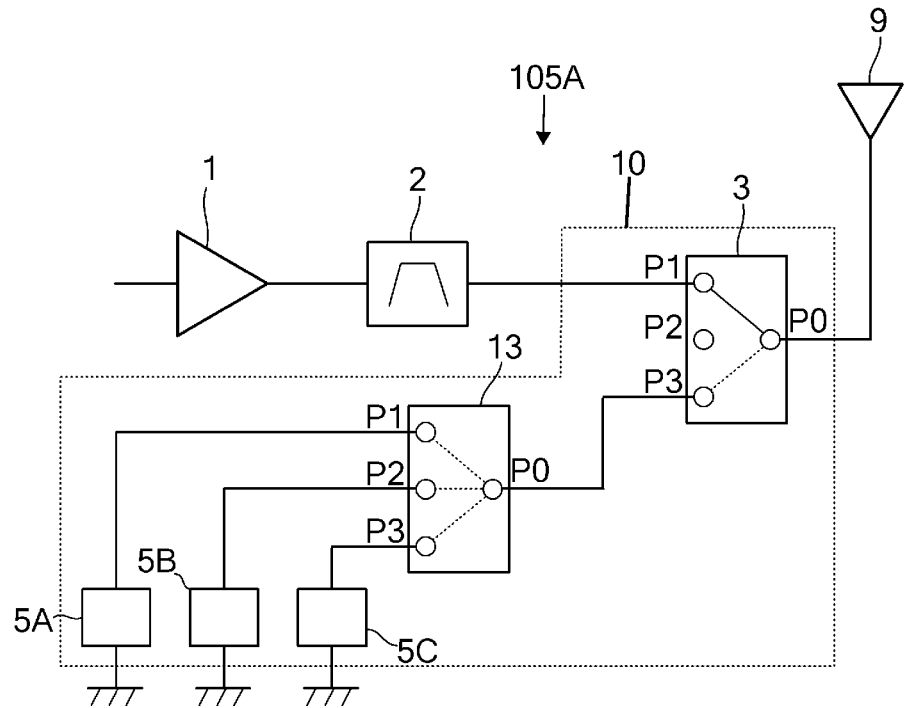
FIG. 22A is a block diagram of a front-end circuit 105A according to a fifth embodiment.
Figure 22B:
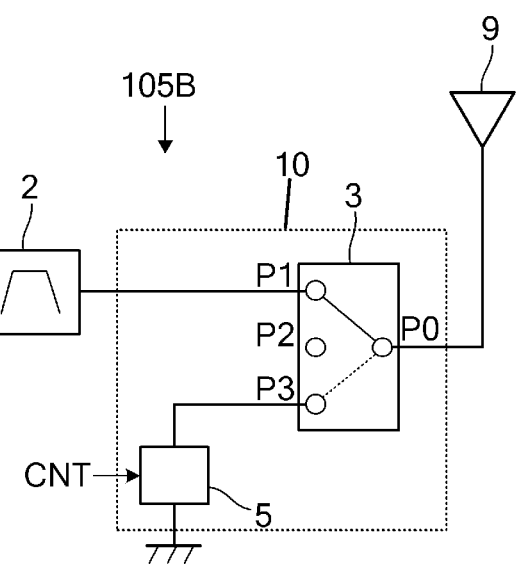
FIG. 22B is a block diagram of another front-end circuit 105B according to the fifth embodiment.

FIG. 22A is a block diagram of a front-end circuit 105A according to the fifth embodiment, and FIG. 22B is a block diagram of another front-end circuit 105B according to the fifth embodiment.

In the example shown in FIG. 22A, the additional matching circuit 10 is composed of a switch 13 connected to the input/output port P3 of the antenna switch 3, and matching circuits 5A, 5B, 5C each composed of a reactance element connected between an associated one of input/output ports P1, P2, P3 of the switch 13 and the ground. The switch 13 selects any one or two or more of the matching circuits 5A, 5B, 5C at a time. The switch 13 is an example of the "circuit that selectively connects multiple matching circuits" according to the present disclosure. In this way, multiple matching circuits may be provided. The degree of mismatching may be configured to be adjusted according to the number of matching circuits connected to the signal path.

In this way, with such a configuration that multiple matching circuits are selectively connected to the signal path, it is possible to switch matching characteristics among three or more multiple modes, so it is possible to select further suitable matching characteristics to increase the insertion loss in frequency bands of intermodulation distortions in a communication band.

In the example shown in FIG. 22B, the additional matching circuit 10 is composed of the matching circuit 5 composed of a variable reactance connected between the input/output port P3 of the antenna switch 3 and the ground. The matching circuit 5 is composed of a variable reactance circuit of which the reactance is set by a control signal CNT that is given from an external device. In this way, the degree of mismatching may be adjusted by setting a reactance connected to the signal path in accordance with a control signal.

In this way, with such a configuration that a matching circuit is composed of a variable reactance circuit, it is possible to switch the matching characteristics among multiple modes, so it is possible to select further suitable characteristics to increase the insertion loss in frequency bands of intermodulation distortions in a communication band.

Lastly, the description of the above-described embodiments is illustrative in all respects and is not restrictive. Modifications or alterations are possible as needed by persons skilled in the art. The scope of the present disclosure is described not by the above-described embodiments but by the appended claims. The scope of the present disclosure encompasses modifications from the embodiments within the range equivalent to the appended claims.

For example, in the examples shown in the above embodiments, examples in which an attenuation range is formed on each of frequencies higher than and lower than the frequency bands of two component carriers PCC, SCC when the matching circuits 5, 6 are connected to the signal path are described. In other words, an example in which the insertion loss in a frequency band including an intermodulation distortion that appears at the lower frequencies increases and the insertion loss in a frequency band including an intermodulation distortion that appears at the higher frequencies increases is described. However, the present disclosure is not limited thereto. Depending on a state where the matching circuit is connected to the signal path, an attenuation range may be formed on one of frequencies higher and lower than the frequency bands of two component carriers PCC, SCC. In other words, particularly, the insertion loss in one of a frequency band including an intermodulation distortion that appears at the lower frequencies and a frequency band including an intermodulation distortion that appears at the higher frequencies may be configured to be increased.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A front-end circuit that switches between an intra-band carrier aggregation mode in which multiple transmission waves having different frequency bands included in a single communication band are transmitted at a time and a single mode in which a transmission wave of one frequency band included in the single communication band is transmitted, a frequency component of part of multiple intermodulation distortions that are generated by the multiple transmission waves being included in the communication band in the intra-band carrier aggregation mode, the front-end circuit comprising:
   a power amplifier circuit configured to amplify power of the multiple transmission waves;
   a first transmission filter provided in a signal path from the power amplifier circuit to an antenna and configured to pass a predetermined transmission frequency band of an output signal of the power amplifier circuit;
   a matching circuit; and
   a switch configured to connect or disconnect the matching circuit to or from the signal path in accordance with the intra-band carrier aggregation mode or the single mode, wherein
   the switch and the matching circuit are configured to increase an insertion loss in a frequency band of an intermodulation distortion within the communication band in the intra-band carrier aggregation mode as compared to an insertion loss in a frequency band of an intermodulation distortion within the communication band in the single mode,
   the switch includes an antenna port, a first input/output port connected to the first transmission filter, and a second input/output port connected to the matching circuit,
   in the single mode, the switch disconnects the antenna port from the second input/output port and connects the antenna port to the first input/output port, and
   in the intra-band carrier aggregation mode, the switch connects the antenna port to the first input/output port and the second input/output port.

2. The front-end circuit according to claim 1, wherein the switch is configured not to connect the matching circuit to the signal path in the single mode and the switch is configured to connect the matching circuit to the signal path in the intra-band carrier aggregation mode.

3. The front-end circuit according to claim 2, wherein in the intra-band carrier aggregation mode, the matching circuit is configured to form an attenuation range at frequencies higher or lower than frequency bands of the multiple transmission waves.

4. The front-end circuit according to claim 2, wherein in the intra-band carrier aggregation mode, the matching circuit is configured to mismatch an impedance of the signal path for a frequency component of the intermodulation distortion included in the communication band.

5. The front-end circuit according to claim 1, wherein the matching circuit is made up of multiple matching circuits, and
   the front-end circuit further comprises a circuit configured to selectively connect the multiple matching circuits to the signal path.

6. The front-end circuit according to claim 2, wherein the matching circuit is made up of multiple matching circuits, and
   the front-end circuit further comprises a circuit configured to selectively connect the multiple matching circuits to the signal path.

7. The front-end circuit according to claim 3, wherein the matching circuit is made up of multiple matching circuits, and
   the front-end circuit further comprises a circuit configured to selectively connect the multiple matching circuits to the signal path.

8. The front-end circuit according to claim 1, wherein the matching circuit is a variable reactance circuit.

9. The front-end circuit according to claim 2, wherein the matching circuit is a variable reactance circuit.

10. The front-end circuit according to claim 3, wherein the matching circuit is a variable reactance circuit.

11. The front-end circuit according to claim 5, wherein the matching circuit is a variable reactance circuit.

12. The front-end circuit according to claim 1, wherein the matching circuit is a second transmission filter different from the first transmission filter and configured to be used in a mode other than the intra-band carrier aggregation mode or the single mode.

13. The front-end circuit according to claim 2, wherein the matching circuit is a second transmission filter different from the first transmission filter and configured to be used in a mode other than the intra-band carrier aggregation mode or the single mode.

14. The front-end circuit according to claim 3, wherein the matching circuit is a second transmission filter different from the first transmission filter and configured to be used in a mode other than the intra-band carrier aggregation mode or the single mode.

15. The front-end circuit according to claim 5, wherein the matching circuit is a second transmission filter different from the first transmission filter and configured to be used in a mode other than the intra-band carrier aggregation mode or the single mode.

16. The front-end circuit according to claim 8, wherein the matching circuit is a second transmission filter different from the first transmission filter and configured to be used in a mode other than the intra-band carrier aggregation mode or the single mode.

17. A front-end circuit that switches between an intra-band carrier aggregation mode in which multiple transmission waves having different frequency bands included in a single communication band are transmitted at a time and a single mode in which a transmission wave of one frequency band included in the single communication band is transmitted, a frequency component of part of multiple intermodulation distortions that are generated by the multiple transmission waves being included in the communication band in the intra-band carrier aggregation mode, the front-end circuit comprising:

a power amplifier circuit configured to amplify power of the multiple transmission waves;

a first duplexer provided in a signal path from the power amplifier circuit to an antenna and configured to pass a predetermined transmission frequency band of an output signal of the power amplifier circuit;

a matching circuit; and a switch configured to connect or disconnect the matching circuit to or from the signal path in accordance with the intra-band carrier aggregation mode or the single mode, wherein the switch and the matching circuit are configured to increase an insertion loss in a frequency band of an intermodulation distortion within the communication band in the intra-band carrier aggregation mode as compared to an insertion loss in a frequency band of an intermodulation distortion within the communication band in the single mode, the switch includes an antenna port, a first input/output port connected to the first duplexer, and a second input/output port connected to the matching circuit, in the single mode, the switch disconnects the antenna port from the second input/output port and connects the antenna port to the first input/output port, and in the intra-band carrier aggregation mode, the switch connects the antenna port to the first input/output port and the second input/output port.

18. The front-end circuit according to claim 17, wherein the matching circuit is a second duplexer different from the first duplexer and configured to be used in a mode other than the intra-band carrier aggregation mode or the single mode.

19. The front-end circuit according to claim 17, further comprising a transmission wave select switch that bifurcates a transmission wave outputted from the power amplifier circuit into multiple signal paths.

20. The front-end circuit according to claim 18, wherein the matching circuit is a π-type CLC circuit including two capacitors and an inductor connected between the transmission wave select switch and the switch.

* * * * *

UNITED STATES PATENT AND TRADEMARK OFFICE
CERTIFICATE OF CORRECTION

PATENT NO. : 11,223,377 B2
APPLICATION NO. : 17/037938
DATED : January 11, 2022
INVENTOR(S) : Kani It is certified that error appears in the above-identified patent and that said Letters Patent is hereby corrected as shown below:

In the Specification

Column 10, Line 22, "7c-type" should be -- $\pi$-type --.

Column 10, Line 64, "7c-type" should be -- $\pi$-type --.

Column 11, Line 45, "7c-type" should be -- $\pi$-type --.

Signed and Sealed this
Thirtieth Day of August, 2022

Katherine Kelly Vidal
*Director of the United States Patent and Trademark Office*